(12) United States Patent
Choe et al.

(10) Patent No.: US 11,843,037 B2
(45) Date of Patent: Dec. 12, 2023

(54) SEMICONDUCTOR DEVICE AND METHOD OF MANUFACTURING THE SEMICONDUCTOR DEVICE

(71) Applicant: Samsung Electronics Co., Ltd., Suwon-si (KR)

(72) Inventors: Dukhyun Choe, Suwon-si (KR); Jinseong Heo, Seoul (KR); Yunseong Lee, Osan-si (KR); Sanghyun Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 17/496,300

(22) Filed: Oct. 7, 2021

(65) Prior Publication Data

US 2022/0302267 A1 Sep. 22, 2022

(30) Foreign Application Priority Data

Mar. 19, 2021 (KR) .................. 10-2021-0036079
Mar. 29, 2021 (KR) .................. 10-2021-0040542

(51) Int. Cl.
*H01L 29/40* (2006.01)
*H01L 29/78* (2006.01)
(Continued)

(52) U.S. Cl.
CPC ........ *H01L 29/408* (2013.01); *H01L 29/4908* (2013.01); *H01L 29/513* (2013.01); *H01L 29/6684* (2013.01); *H01L 29/7833* (2013.01); *H01L 29/78391* (2014.09); *H10K 10/474* (2023.02); *H01L 29/516* (2013.01)

(58) Field of Classification Search
CPC .............. H01L 29/516; H01L 29/6684; H01L 29/78391; H01L 29/408; H10K 10/474
See application file for complete search history.

(56) References Cited

U.S. PATENT DOCUMENTS 6,054,357 A 4/2000 Choi
9,978,868 B2 5/2018 Lai et al.
(Continued)

FOREIGN PATENT DOCUMENTS

KR 10-2020-0010626 A 1/2020
KR 10-2020-0130770 A 11/2020
KR 10-2185788 B1 11/2020

OTHER PUBLICATIONS

Sayeef Salahuddin, et al. "Use of Negative Capacitance to Provided Voltage Amplification for Low Power Nanoscale Devices," Nano Letters, vol. 8, No. 2, pp. 405-410 (2007).
(Continued)

*Primary Examiner* — Raj R Gupta
(74) *Attorney, Agent, or Firm* — Harness, Dickey & Pierce, P.L.C.

(57) ABSTRACT

Provided are a semiconductor device and a method of manufacturing the semiconductor device. The semiconductor device includes a substrate, a channel layer at least one of on or in the substrate, an insulation layer on the substrate, a ferroelectric layer on the insulation layer, a fixed charge layer on an interface between the insulation layer and the ferroelectric layer, the fixed charge layer including charges of a first polarity, and a gate on the ferroelectric layer.

25 Claims, 11 Drawing Sheets

(51) Int. Cl.
*H01L 29/49* (2006.01)
*H01L 29/51* (2006.01)
*H01L 29/66* (2006.01)
*H10K 10/46* (2023.01)

(56) References Cited

U.S. PATENT DOCUMENTS

| | | |
|---|---|---|
| 10,600,808 B2 | 3/2020 | Schroder |
| 10,903,363 B2 | 1/2021 | Yoo et al. |
| 2017/0141235 A1* | 5/2017 | Lai ................... H01L 29/6684 |
| 2019/0074295 A1* | 3/2019 | Schröder ................ H01L 28/40 |
| 2020/0227423 A1 | 7/2020 | Chavan et al. |
| 2021/0118990 A1 | 4/2021 | Jo et al. |
| 2022/0140147 A1 | 5/2022 | Choe et al. |

OTHER PUBLICATIONS

Extended European Search Report dated Apr. 20, 2022 issued in European Patent Application No. 21207090.8.

* cited by examiner

SEMICONDUCTOR DEVICE AND METHOD OF MANUFACTURING THE SEMICONDUCTOR DEVICE

CROSS-REFERENCE TO RELATED APPLICATION

This application is based on and claims priority under 35 U.S.C. § 119 to Korean Patent Application Nos. 10-2021-0036079, filed on Mar. 19, 2021, and 10-2021-0040542, filed on Mar. 29, 2021, in the Korean Intellectual Property Office, the disclosures of each of which are incorporated by reference herein in their entirety.

BACKGROUND

Some example embodiments relate to a semiconductor device and/or a method of manufacturing or fabricating the semiconductor device.

Existing silicon-based transistors have limitations in improving the operating characteristics and/or in shrinking or scaling down. For example, when an operating voltage and current characteristics are measured in the case of existing silicon-based transistors, a subthreshold swing (SS) value is determined according to the equation below. The SS value may be limited to about 60 mV/dec.

$$SS = \frac{k_B T}{q} \ln(10) \left(1 + \frac{C_D}{C_{ins}}\right)$$

In this equation, $k_B$ indicates a Boltzmann constant, T indicates an absolute temperature, q indicates an elementary charge, $C_D$ indicates a capacitance of a depletion layer, and $C_{ins}$ indicates a capacitance of a gate insulator.

With a decrease in the size of a transistor, a power density increases because it is difficult to lower the operating voltage to about 0.8 V or less. Accordingly, there is a limit in scaling down and/or shrinking a device.

SUMMARY

Provided are a semiconductor device and/or a method of manufacturing the semiconductor device.

Additional aspects will be set forth in part in the description which follows and, in part, will be apparent from the description, or may be learned by practice of some example embodiments.

According to some example embodiments, a semiconductor device includes a substrate, a channel layer at least one of on or in the substrate, an insulation layer on the substrate, a ferroelectric layer on the insulation layer, a fixed charge layer on an interface between the insulation layer and the ferroelectric layer, the fixed charge layer including charges of a first polarity, and a gate on the ferroelectric layer.

The fixed charge layer may have a charge density that generates a negative capacitance effect in response to the channel layer being in an inversion state.

At least one of the semiconductor device may include a PMOS structure and the fixed charge layer has a negative (−) charge density in the PMOS structure, or the semiconductor device may include an NMOS structure and the fixed charge layer has a positive (+) charge density in the NMOS structure.

The fixed charge layer may have a charge density greater than −5 µC/cm² and less than 0, or the fixed charge layer may have a charge density greater than 0 and less than +5 µC/cm².

The fixed charge layer may include at least one of dopants or an oxygen vacancy.

The dopants may include at least one selected from Al, P, Ca, Sc, V, Cr, Sr, Y, Nb, Mo, Tm, Yb, Lu, Ta, and W.

The channel layer may be in an upper portion of the substrate and integral with the substrate, and a source and a drain are on respective sides of the channel layer.

The channel layer may be on the substrate and separate from the substrate, and a source and a drain are on respective sides of the channel layer.

The channel layer may include at least one of Si, Ge, SiGe, Group III-V semiconductor, an oxide semiconductor, a nitride semiconductor, an oxynitride semiconductor, a two-dimensional (2D) material, quantum dots, and an organic semiconductor.

The ferroelectric layer may include at least one of a fluorite-based material or perovskite.

The ferroelectric layer may include at least one of HfO, ZrO, and HfZrO.

The ferroelectric layer may include at least one dopant from among Si, Al, La, Y, Sr, and Gd.

A work function of the gate may be configured to control a threshold voltage of the semiconductor device.

According to some example embodiments, a method of manufacturing a semiconductor device may include preparing a substrate having a channel layer, forming an insulation layer on the channel layer, forming, on the insulation layer, a fixed charge layer including charges of a first polarity, forming a ferroelectric layer on the fixed charge layer, and forming a gate on the ferroelectric layer.

The method may include controlling a threshold voltage of the semiconductor device by adjusting a work function of the gate.

The channel layer is at least one of integral with the substrate or separate from the substrate.

The fixed charge layer is formed by at least one of depositing dopant particles on the insulation layer or by forming an oxygen vacancy by processing a surface of the insulation layer.

At least one of the semiconductor device includes a PMOS structure, and the fixed charge layer has a negative (−) charge density In the PMOS structure, or the semiconductor device includes an NMOS structure, and the fixed charge layer has a positive (+) charge density in the NMOS structure.

The ferroelectric layer includes at least one of fluorite-based material or perovskite.

The ferroelectric layer includes at least one of HfO, ZrO, and HfZrO.

According to some example embodiments, a semiconductor device includes a first channel layer in a substrate, an insulation layer on the first channel layer, a ferroelectric layer on the insulation layer, and a first fixed charge layer on an interface between the insulation layer and the ferroelectric layer, the first fixed charge layer including charges of a first polarity.

The semiconductor device may further comprise a source region in the substrate, the source region on a first side of the first channel layer, and a first lightly doped drain region in the substrate, the first lightly doped drain region between the source region and the first channel layer.

The semiconductor device may further comprise a second channel layer in the substrate, the insulation layer on the second channel layer, the ferroelectric layer on the first channel layer and on the second channel layer, and a second fixed charge layer on a second interface between the insulation layer and the ferroelectric layer over the second channel layer.

The first fixed charge layer has a negative (−) charge density, and the second fixed charge layer has a positive (+) charge density.

The semiconductor device may further comprise a drain region in the substrate, the drain region on a first side of the second channel layer, and a second lightly doped drain region in the substrate, the second lightly doped drain region between the drain region and the second channel layer

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF SOME EXAMPLE EMBODIMENTS

Figure 1:
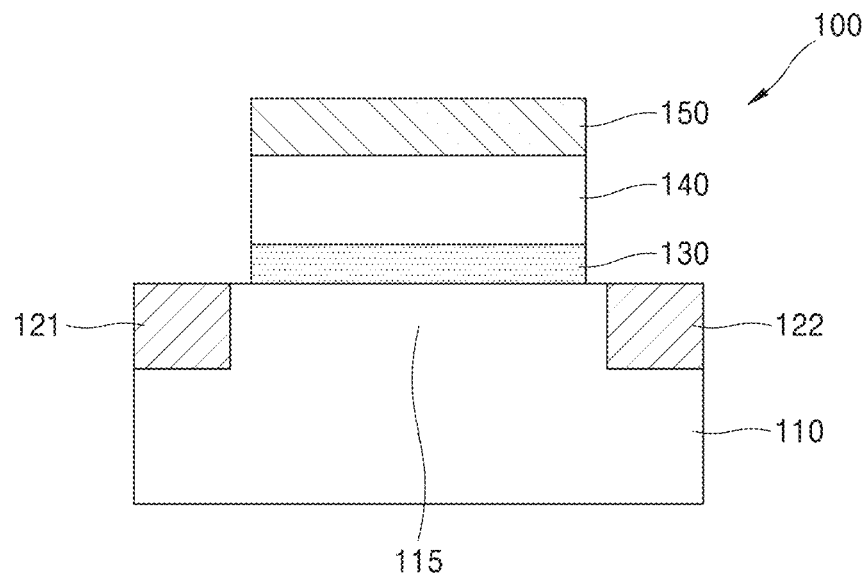
FIG. 1 is a schematic cross-sectional view of a general semiconductor device including ferroelectrics.

Reference will now be made in detail to some embodiments, examples of which are illustrated in the accompanying drawings, wherein like reference numerals refer to the like elements throughout. In this regard, example embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Some example embodiments will now be described more fully with reference to the accompanying drawings. Like reference numerals in the drawings denote like elements, and, in the drawings, the sizes of elements may be exaggerated for clarity and for convenience of explanation. In this regard, the present embodiments may have different forms and should not be construed as being limited to the descriptions set forth herein.

When a layer is referred to as being ""on" another layer or substrate, it can be directly on/below/on the left side of/on the right side of the other layer or substrate, or intervening layers may also be present. An expression used in the singular encompasses the expression of the plural, unless it has a clearly different meaning in the context. The terms "comprises" and/or "comprising" or "includes" and/or "including" when used in this specification, specify the presence of stated elements, but do not preclude the presence or addition of one or more other elements.

The use of the terms "a" and "an" and "the" and similar referents are to be construed to cover both the singular and the plural. The operations that constitute a method described herein can be performed in any suitable order unless otherwise indicated herein or otherwise clearly contradicted by context, but embodiments are not limited to the stated order.

The terms "unit", "-er (-or)", and "module" when used in this specification refers to a unit in which at least one function or operation is performed, and may be implemented as hardware, software, or a combination of hardware and software.

The connecting lines, or connectors shown in the various figures presented are intended to represent some example functional relationships and/or physical or logical couplings between the various elements. It should be noted that many alternative or additional functional relationships, physical connections or logical connections may be present in a practical device.

The use of any and all examples, or some example language provided herein, is intended merely to better illuminate inventive concepts and does not pose a limitation on the scope of example embodiments unless otherwise claimed.

FIG. 1 is a schematic cross-sectional view of a general semiconductor device including ferroelectrics. A semiconductor device 100 of FIG. 1 may be or may include a ferroelectric field effect transistor (FeFET).

Referring to FIG. 1, the semiconductor device 100 includes a substrate 110, an insulation layer 130, a ferroelectric layer 140, and a gate electrode or a gate 150. A channel layer 115 is located in an upper portion of the substrate 110 and may be integrally formed with the substrate 110, e.g. may be formed within the substrate 110. The substrate 110 may be or may include a semiconductor substrate, such as but not limited to for example a silicon substrate such as a silicon wafer and/or a silicon-on-insulator (SOI) substrate. The substrate 110 may be doped, e.g. may be lightly doped with at least one of boron, phosphorus, or arsenic; however, example embodiments are not limited thereto.

The channel layer 115 may be provided in an upper portion of the substrate 110 that faces the gate 150, and a source 121 and a drain 122 may be provided on both sides of the channel layer 115, respectively. For example, a source 121 may be on one side of the gate 150 and a drain 122 may be on another side of the gate 150.

The source 121 may be electrically connected to one side of the channel layer 115, and the drain 122 may be electrically connected to the other side of the channel layer 115. The source and drain 121 and 122 may be formed by doping, e.g. implanting impurities into different regions of the substrate 110, and a region of the substrate 110 between the source 121 and the drain 122 may be defined as the channel layer 115.

The impurities may be or may include, for example, at least one of boron, phosphorus, arsenic, or carbon. Furthermore there may be a first hookup, or light-doped drain (LDD) region (not illustrated), between the source region 121 and the channel region 115 and between the drain region 122 and the channel region 122. Alternatively or additionally there may be a second halo, or pocket region between the source region 121 and the channel region 115 and between the drain region 122 and the channel region 122.

The substrate 110 integrally formed with the channel layer 115 may be, for example, a semiconductor substrate including Si, Ge, SiGe, or Group III-V semiconductor, and may be single-crystal or polycrystalline, and/or may be lightly doped.

The insulation layer 130, the ferroelectric layer 140, and the gate 150 are sequentially stacked on the substrate 110. The insulation layer 130 is provided on the substrate 110 (in detail, the channel layer 115). The insulation layer 130 may include, for example, at least one of silicon oxide, silicon nitride, or the like, but example embodiments are not limited thereto.

The ferroelectric layer 140 is provided on the insulation layer 130. The ferroelectric layer 140 may include, for example, ferroelectrics such as a fluorite-based material and/or a perovskite. The ferroelectrics have a spontaneous dipole (electric dipole), namely, spontaneous polarization, because a charge distribution within a unit cell is non-centrosymmetric in a crystallized material structure. The ferroelectrics may also have a remnant polarization due to a dipole even in a state where there are no external electric fields. In the ferroelectrics, a direction of polarization may be switched in units of domain by an external electric field.

The gate 150 is provided on the ferroelectric layer 140. The gate 150 may be disposed opposite to the channel layer 115 of the substrate 110. The gate 150 may include, for example, a conductive metal such as at least one of doped polysilicon, tungsten, or titanium.

In the semiconductor device 100 of FIG. 1, as will be described later, the ferroelectric layer 140 is formed between the gate 150 and the insulation layer 130, and thus a subthreshold swing (SS) of the semiconductor device 100 may be lowered, for example, due to voltage amplification according to a negative capacitance effect.

Figure 2:
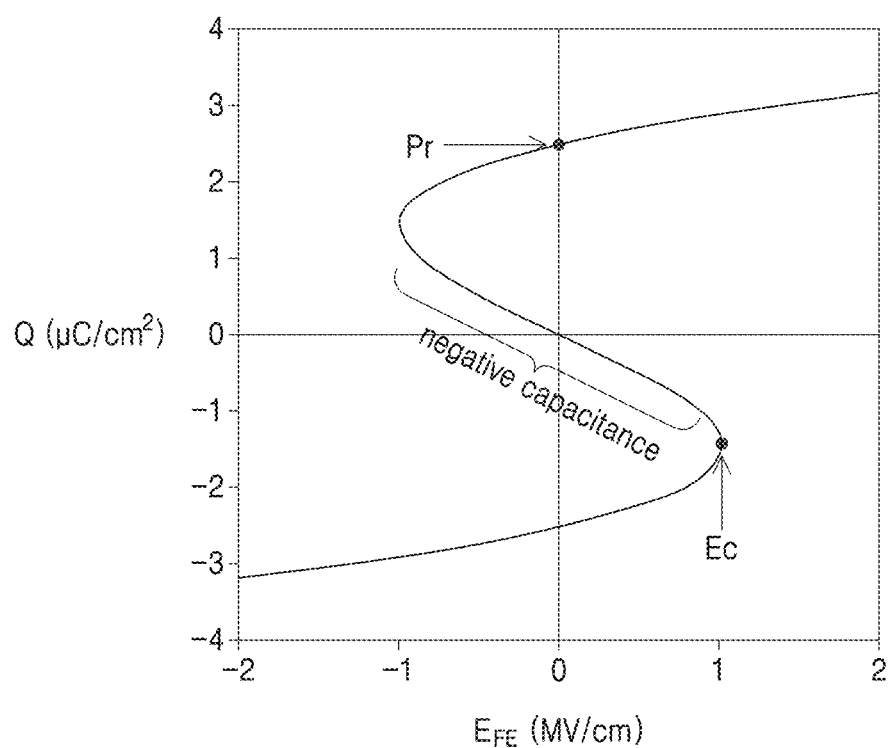
FIG. 2 is a charge (Q)-electric field ($E_{FE}$) graph of an "S" curved shape appearing when a charge (or polarization value) Q of ferroelectrics and an electric field $E_{FE}$ applied to ferroelectrics were measured under a specific condition according to a Landau model that describes ferroelectrics.

FIG. 2 is a charge (Q)-electric field ($E_{FE}$) graph of an "S" curved shape appearing when a charge (or polarization value) Q of ferroelectrics and an electric field $E_{FE}$ applied to ferroelectrics are measured under a specific condition according to a Landau model that describes ferroelectrics. In FIG. 2, "$P_r$" indicates a remnant polarization corresponding to a polarization value within ferroelectrics when no electric fields are applied, and "$E_c$" indicates a coercive electric field corresponding to the size of a critical electric field capable of changing the direction of polarization.

Referring to FIG. 2, the capacitance in ferroelectrics has a value proportional to the slope or inclination of the Q-$E_{FE}$ graph. In this case, a negative capacitance region having a negative (−) slope or inclination exists in the Q-$E_{FE}$ graph of the "S" curved shape, and voltage amplification occurs when a domain within ferroelectrics is switched due to a negative capacitance effect occurring in the negative capacitance region. Accordingly, the SS may be lowered.

As the remnant polarization Pr or the coercive electric field $E_c$ increases in the Q-$E_{FE}$ graph of the "S" curved shape, the negative capacitance effect may be increased. Accordingly, performance of the semiconductor device may be more improved by further lowering the SS. As such, the physical property of ferroelectrics, such as the remnant polarization Pr or the coercive electric field $E_c$, is improved by adjusting a method of depositing ferroelectrics and/or a method of annealing ferroelectrics, which may lead to an increase in the negative capacitance effect.

Figure 3:
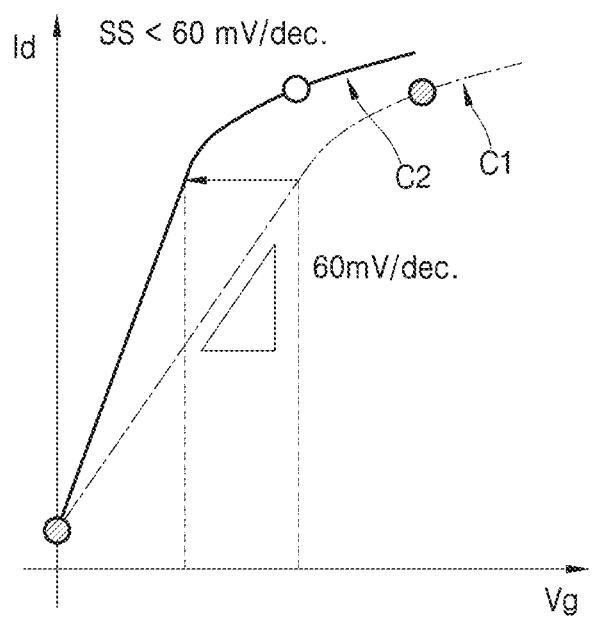
FIG. 3 is a graph for explaining an effect where a subthreshold swing (SS) feature of the semiconductor device of FIG. 1 is improved.

FIG. 3 is a graph for explaining an effect where the SS feature of the semiconductor device 100 of FIG. 1 is improved. In FIG. 3, "C1" illustrates an operating voltage Vg and a current Id of an existing silicon-based field effect transistor, and "C2B" illustrates an operating voltage Vg and a current Id of the semiconductor device (ferroelectric field effect transistor) 100 of FIG. 1.

Referring to FIG. 3, the SS of an existing silicon-based transistor is limited to about 60 mV/dec. However, in the semiconductor device 100 of FIG. 1, voltage amplification may occur due to a negative capacitance effect according to the use of the ferroelectric layer 140, and thus the swing SS may be lowered to 60 mV/dec or less. Therefore, low-power driving is possible by amplifying a voltage that is applied to the semiconductor device 100, and the scale, e.g. the channel width, of the semiconductor device 100 may be lowered.

Figure 4:
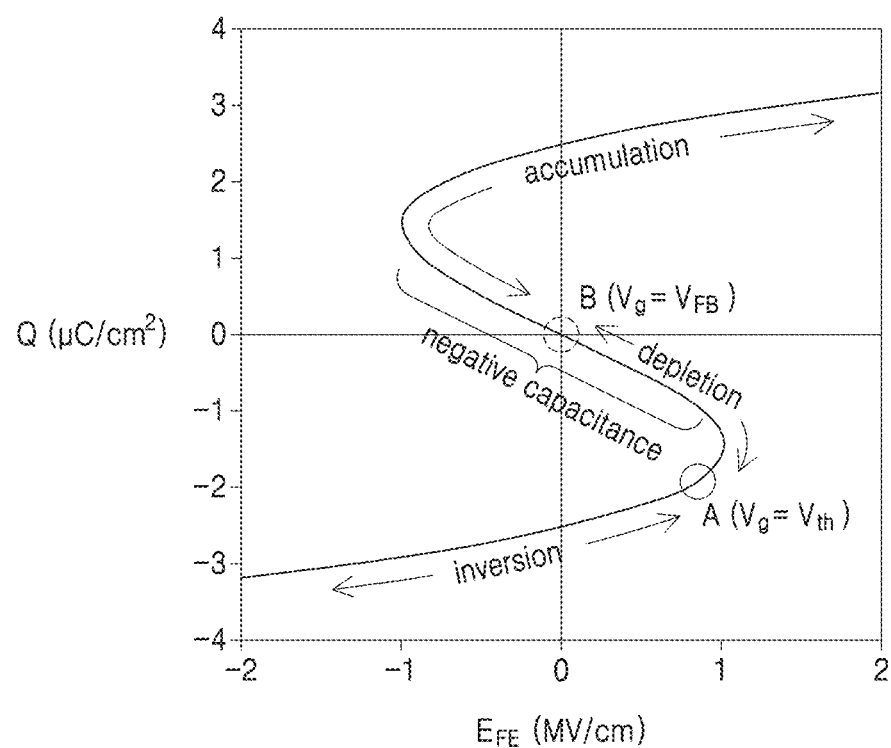
FIG. 4 illustrates a correlation between a state of the semiconductor device of FIG. 1 and a negative capacitance region, through the Q-$E_{FE}$ graph of the "S" curved shape of the ferroelectrics of FIG. 2.

FIG. 4 illustrates a correlation between a state of the semiconductor device of FIG. 1 and a negative capacitance region, through a Q-$E_{FE}$ graph of the "S" curved shape of the semiconductor device of FIG. 1. In FIG. 4, a point "A" indicates a location of a threshold voltage $V_{th}$, and a point "B" indicates a location of a planarization or flat band voltage $V_{FB}$ that is applied to the gate 150 to offset band bending of a semiconductor.

Referring to FIG. 4, when a gate voltage $V_g$ is less than the planarization voltage $V_{FB}$, the semiconductor device 100 (in detail, the channel layer 115) enters into an accumulation state, and when the gate voltage $V_g$ is greater than the planarization voltage $V_{FB}$ and less than the threshold voltage $V_{th}$, the semiconductor device 100 enters a depletion state. When the gate voltage $V_g$ is greater than the threshold voltage $V_{th}$, the semiconductor device 100 enters an inversion state.

In the semiconductor device 100 of FIG. 1, as shown in FIG. 4, the negative capacitance effect occurs in the accumulation state and the depletion sate of the semiconductor device 100. However, in this case, performance of the semiconductor device 100 may not be more improved because voltage amplification is not large, as compared to a case where the negative capacitance effect occurs in the inversion state of the semiconductor device 100.

Figure 5:
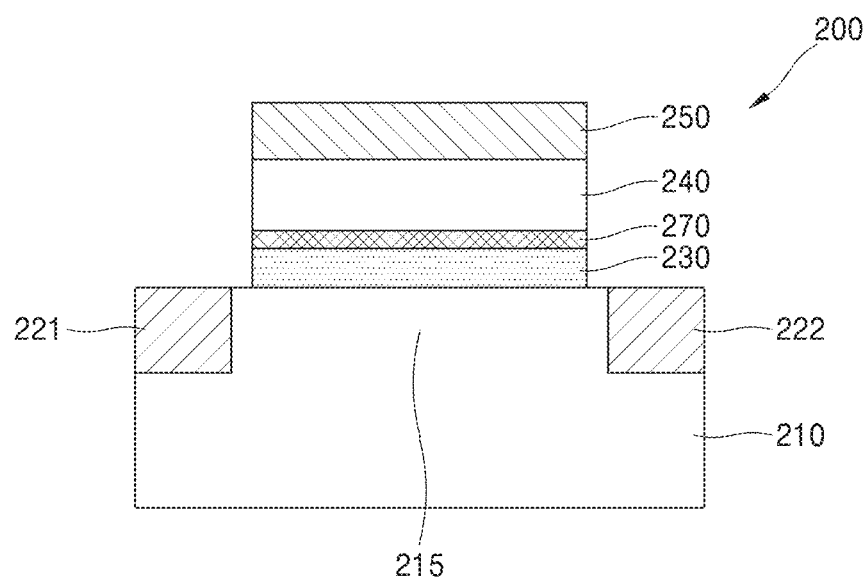
FIG. 5 is a schematic cross-sectional view of a semiconductor device according to some example embodiments.

FIG. 5 is a schematic cross-sectional view of a semiconductor device 200 according to some example embodiments. The semiconductor device 200 of FIG. 5 may be or may include a ferroelectric field effect transistor (FeFET).

Referring to FIG. 5, the semiconductor device 200 includes a substrate 210, an insulation layer 230, a fixed charge layer 270, a ferroelectric layer 240, and a gate 250. A channel layer 215 is located in an upper portion of the substrate 210 and is integrally formed with the substrate 210. The channel layer 215 may be provided in an upper portion of the substrate 210 that faces the gate 250, and a source 221 and a drain 222 may be provided on both sides of the channel layer 215, respectively.

The source 221 may be electrically connected to one side of the channel layer 215, and the drain 222 may be electrically connected to the other side of the channel layer 215. The source and drain 221 and 222 may be formed by doping, e.g. by implanting, impurities into different regions of the substrate 210, and a region of the substrate 210 between the source 221 and the drain 222 may be defined as the channel layer 215. The impurities may be or may include, for example, at least one of boron, phosphorus, or arsenic; however, example embodiments are not limited thereto.

The substrate 210 may be or may include, for example, a Si substrate, e.g. a lightly-doped single crystal silicon substrate, but may be a semiconductor substrate including a material other than Si, for example, Ge, SiGe, or Group III-V semiconductor. In this case, the channel layer 215 may include Si, Ge, SiGe or Group III-V semiconductor. However, example embodiments are not limited thereto. For example, the substrate 210 maybe or may include a silicon-on-insulator (SOI) substrate. As will be described later, the channel layer 215 may not be formed as a portion of the substrate 210 but may be formed on or in a material layer separate from the substrate 210.

When a p-type semiconductor substrate is used as the substrate 210 and the source and drain 221 and 222 include n-type impurities such as at least one of phosphorus or arsenic, a semiconductor device 200 of a NMOS structure may be implemented. Alternatively or additionally when an n-type semiconductor substrate is used as the substrate 210 and the source and drain 221 and 222 include p-type impurities such as boron, a semiconductor device 200 of a PMOS structure may be implemented.

The insulation layer 230, the fixed charge layer 270, the ferroelectric layer 240, and the gate 250 are sequentially stacked on the substrate 210. The insulation layer 230 is provided on the substrate 210 (in detail, the channel layer 215). The insulation layer 230 may include a paraelectric material and/or a high-k material. For example, the insulation layer 230 may include at least one of silicon oxide, silicon nitride, aluminum oxide, hafnium oxide, or zirconium oxide or may include a 2D insulator such as h-BN. However, this is merely an example, and example embodiments are not limited thereto.

The fixed charge layer 270 and the ferroelectric layer 240 are sequentially provided on the insulation layer 230. The ferroelectric layer 240 may include, for example, ferroelectrics such as a fluorite-based material and/or a perovskite. The perovskite may include, for example, at least one of PZT, $BaTiO_3$, or $PbTiO_3$. The fluorite-based material may include, for example, at least one oxide selected from Hf, Si, Al, Zr, Y, La, Gd, and Sr.

For example, the ferroelectric layer 240 may include at least one of HfO, ZrO, and HfZrO. HfO, ZrO or HfZrO constituting or included in the ferroelectric layer 240 may have a crystal structure of an orthorhombic crystal system. On the other hand, HfO, ZrO or HfZrO constituting or included in the high-k material may have a crystal structure of a monoclinic crystal system. The ferroelectric layer 240 may further include at least one dopant from among Si, Al, La, Y, Sr, and Gd. However, the aforementioned materials are only an example, and various other materials may be used to form the ferroelectric layer 240.

The fixed charge layer 270 including charges of a specific (or, alternatively, predetermined) polarity may be provided between the insulation layer 230 and the ferroelectric layer 240. The fixed charge layer 270 may have a positive (+) polarity or a negative (−) polarity.

As will be described later, the fixed charge layer 270 is provided on an interface between the insulation layer 230 and the ferroelectric layer 240 and thus adjusts the negative capacitance region due to a charge density of the fixed charge layer 270, thereby generating a negative capacitance effect in the inversion state of the semiconductor device 200 (in detail, the channel layer 215). To this end, the fixed charge layer 270 may have, for example, a specific or predetermined positive (+) charge density or a specific or predetermined negative (−) charge density. In detail, the fixed charge layer 270 of the semiconductor device 200 of a PMOS structure may have a negative (−) charge density. The negative (−) charge density may be, for example, greater than about −5 $\mu C/cm^2$ and less than 0. Alternatively, the fixed charge layer 270 of the semiconductor device 200 of an NMOS structure may have a positive (+) charge density. The positive (+) charge density may be greater than 0 and less than +5 $\mu C/cm^2$.

As will be described later, the fixed charge layer 270 may be formed by depositing dopant particles including charges of a specific or predetermined polarity on a surface of the insulation layer 230, and/or by forming an oxygen vacancy by processing a surface of the insulation layer 230. The dopant particles may include at least one selected from, for example, Al, P, Ca, Sc, V, Cr, Sr, Y, Nb, Mo, Tm, Yb, Lu, Ta, and W. However, example embodiments are not limited thereto.

The gate 250 is provided on the ferroelectric layer 240. The gate 250 may be disposed opposite to the channel layer 215 of the substrate 210. The gate 250 may include, for example, a conductive metal, such as at least one of doped polysilicon or tungsten.

Figure 6A:
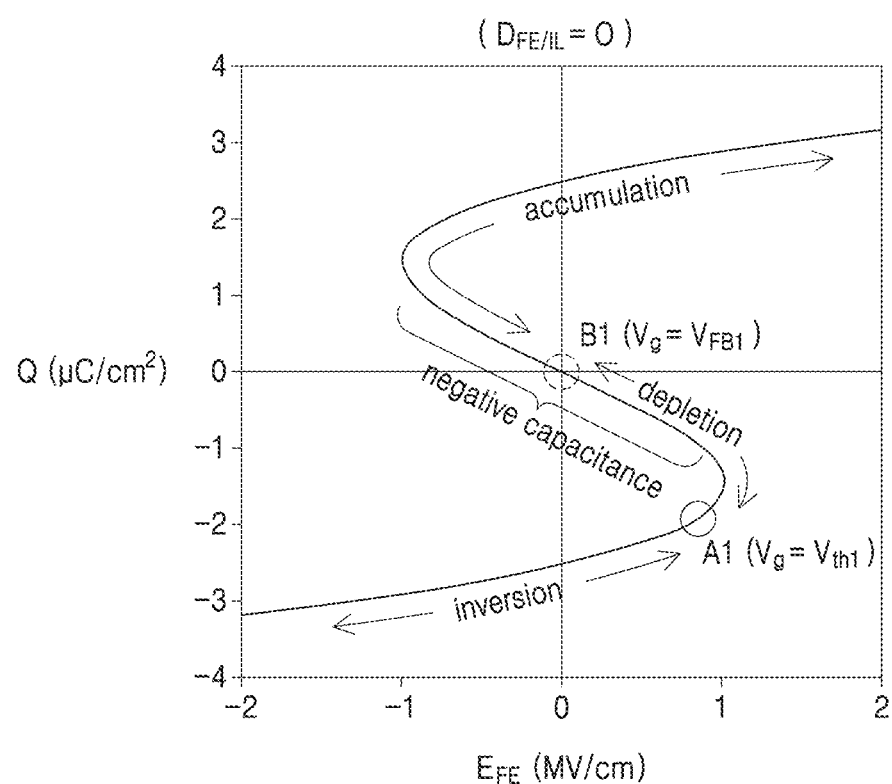
FIGS. 6A through 6C illustrate a correlation between a state of the semiconductor device of FIG. 5 and a negative capacitance region according to a charge density of a fixed charge layer in the semiconductor device of FIG. 5.
Figure 6B:
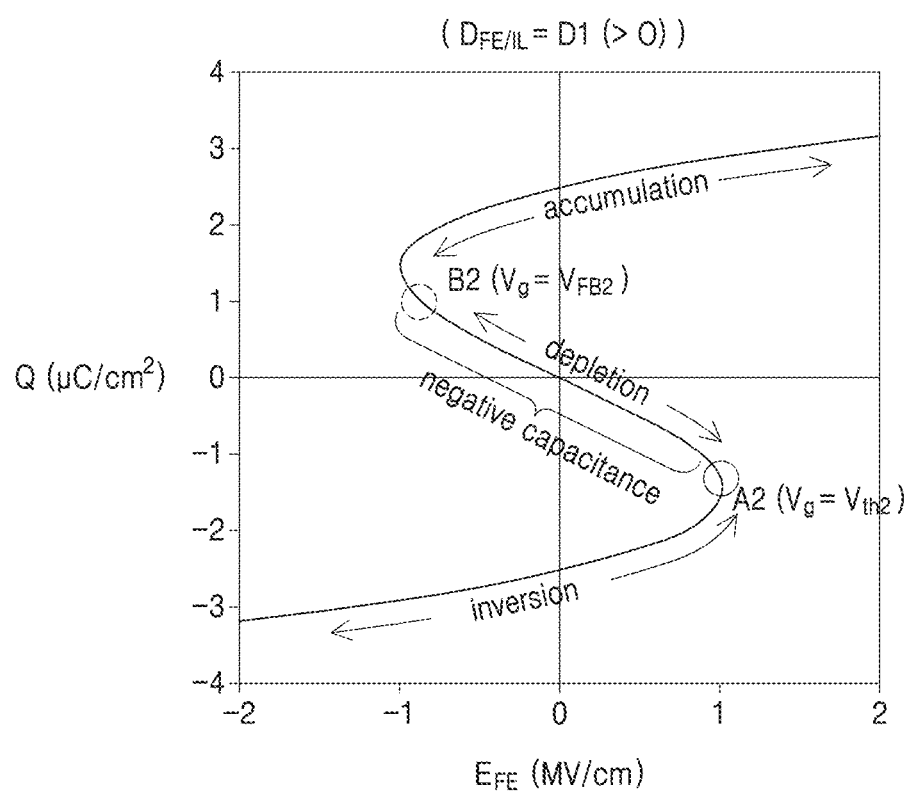
Figure 6C:
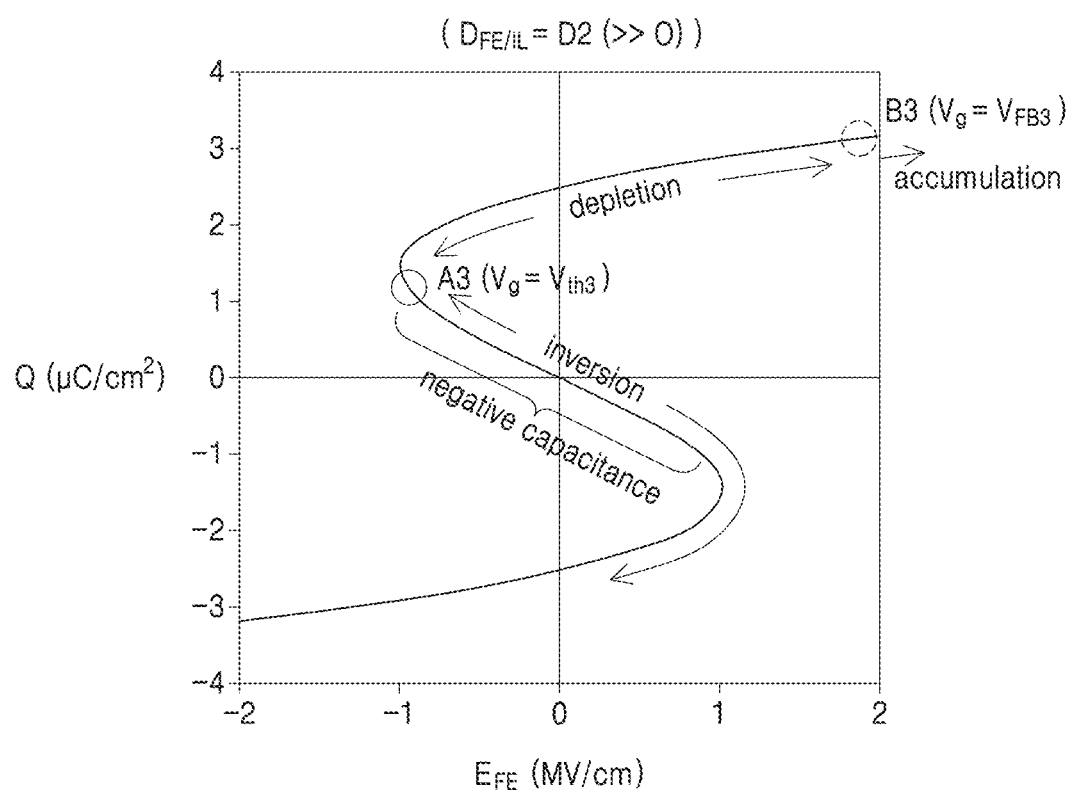

FIGS. 6A through 6C illustrate a correlation between a state of the semiconductor device of FIG. 5 and a negative capacitance region according to a charge density $D_{FE/IL}$ of a fixed charge layer in the semiconductor device of FIG. 5. A case where the semiconductor device 200 of FIG. 5 is a semiconductor device of an NMOS structure will now be described for illustrative purposes; however, example embodiments are not limited thereto.

FIG. 6A illustrates a correlation between a state of the semiconductor device 200 and a negative capacitance region when the charge density $D_{FE/IL}$ of the fixed charge layer 270 is "0", through a Q-$E_{FE}$ graph of an "S" curved shape of ferroelectrics. This case is the same as the case of the semiconductor device 100 of FIG. 1 having no fixed charge layers 270.

Referring to FIG. 6A, the negative capacitance effect is generated when the semiconductor device 200 is in an accumulation state and a depletion state. In FIG. 6A, a point "A1" indicates a location of a first threshold voltage $V_{th1}$, and a point "B1" indicates a location of a first flat band or planarization voltage $V_{FB1}$.

FIG. 6B illustrates a correlation between a state of the semiconductor device 200 and a negative capacitance region when the charge density DFE/IL of the fixed charge layer 270 is "D1(>0)", through a Q-EFE graph of an "S" curved shape of ferroelectrics.

Referring to FIG. 6B, the negative capacitance effect is generated when the semiconductor device 200 is in a depletion state. In FIG. 6B, a point "A2" indicates a location of a second threshold voltage $V_{th2}$, and a point "B2" indicates a location of a second flat band or planarization voltage $V_{FB2}$.

FIG. 6C illustrates a correlation between a state of the semiconductor device 200 and a negative capacitance region when the charge density DFE/IL of the fixed charge layer 270 is "D2(>>0)", which is a greater positive (+) value than D1, through a Q-EFE graph of an "S" curved shape of ferroelectrics.

Referring to FIG. 6C, the negative capacitance effect is generated when the semiconductor device 200 is in an inversion state. In FIG. 6C, a point "A3" indicates a location of a third threshold voltage $V_{th3}$, and a point "B3" indicates a location of a third planarization voltage $V_{FB3}$.

As described above, the semiconductor device 200 of FIG. 5 may adjust the negative capacitance region by changing the charge density of the fixed charge layer 270, and thus may generate a negative capacitance effect when the semiconductor device 200 is in a specific or desired state. For example, as shown in FIG. 6C, the negative capacitance effect may be generated in an inversion state of the semiconductor device 200. In this case, voltage amplification may be increased or maximized, and thus performance of the semiconductor device 200 may be more improved.

A case where the fixed charge layer 270 has a positive (+) charge density to generate the negative capacitance effect in an inversion state of the semiconductor device 200 when the semiconductor device 200 is a semiconductor device of an NMOS structure has been described with reference to FIGS. 6A through 6C. When the semiconductor device 200 is a semiconductor device of a PMOS structure, the fixed charge layer 270 has a negative (−) charge density to generate the negative capacitance effect in an inversion state of the semiconductor device 200. For example, in a semiconductor device of an NMOS structure, the fixed charge layer 270 may have a charge density greater than 0 and less than +5 µC/cm², and, in a semiconductor device of a PMOS structure, the fixed charge layer 270 may have a charge density greater than −5 µC/cm² and less than 0.

Referring to FIGS. 6A through 6C, as the charge density of the fixed charge layer 270 changes from "0" to "D2", a threshold voltage of the semiconductor device 200 changes from "$V_{th1}$" to "$V_{th3}$". In this case, when a work function of the gate 250 is adjusted, the threshold voltage of the semiconductor device 200 may be controlled to have a desired value. For example, when work function of the gate 250 is adjusted, a band alignment between a gate metal and ferroelectrics is achieved by an interfacial dipole, and thus the threshold voltage of the semiconductor device 200 may be controlled to have a specific or desired value. Thus, even when the charge density of the fixed charge layer 270 changes, the threshold voltage of the semiconductor device 200 may be more constantly maintained as a desired value by adjusting the work function of the gate 250.

In addition to or alternatively to adjusting a work function of the gate 250, the semiconductor device 100 may include other regions that adjust a threshold voltage of the semiconductor device 200. For example, the semiconductor device 100 may include a halo or pocket region in the substrate 210. Alternatively or additionally, there may be other regions, for example under the channel region 215, that also adjust a threshold voltage of the semiconductor device 200.

As described above, the semiconductor device 200 according to an embodiment may adjust the negative capacitance region according to a state of the semiconductor device 200 by changing the charge density of the fixed charge layer 270. For example, voltage amplification may be increased or maximized by generating the negative capacitance effect in an inversion state of the semiconductor device 200 by using the fixed charge layer 270, and thus performance of the semiconductor device 200 may be more improved.

Because the threshold voltage of the semiconductor device 200 may be controlled, for example by adjusting the work function of the gate 250, the threshold voltage of the semiconductor device 200 may be constantly or more constantly maintained as a specific or desired value by adjusting the work function of the gate 250. The remnant polarization Pr or the coercive electric field Ec of ferroelectrics is increased by adjusting a method of depositing ferroelectrics or a method of annealing ferroelectrics, leading to an improvement in the negative capacitance effect.

Figure 7:
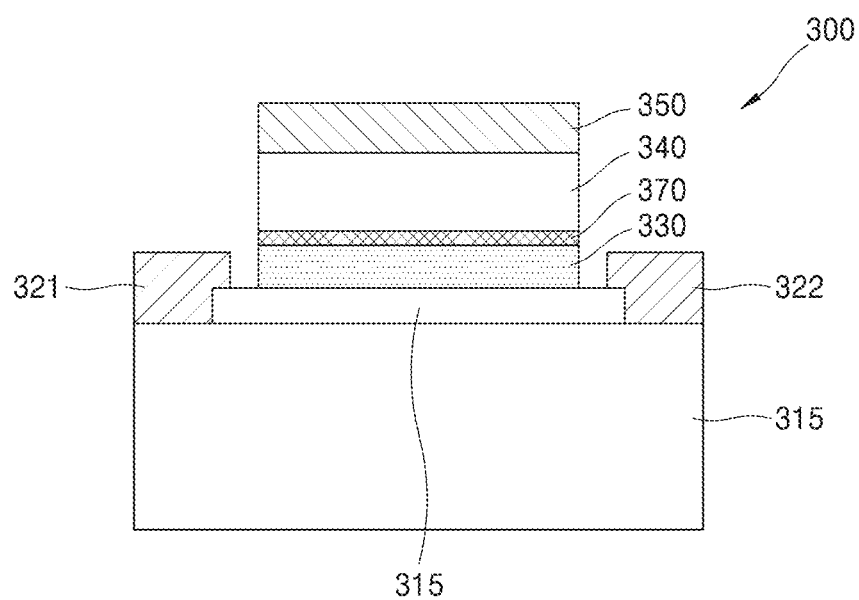
FIG. 7 is a schematic cross-sectional view of a semiconductor device according to some example embodiments.

FIG. 7 is a schematic cross-sectional view of a semiconductor device 300 according to some example embodiments. The semiconductor device 300 of FIG. 7 is similar to the semiconductor device 200 of FIG. 5 except that a channel layer 315 is provided separately from a substrate 310.

Referring to FIG. 7, the semiconductor device 300 includes a substrate 310, a channel layer 315, an insulation layer 330, a fixed charge layer 370, a ferroelectric layer 340, and a gate 350. The channel layer 315 may be provided in an upper portion of the substrate 310 that faces the gate 350, and a source 321 and a drain 322 may be provided on both sides of the channel layer 315, respectively.

The substrate 310 may include, for example, Si, Ge, SiGe, or Group III-V semiconductor, but example embodiments are not limited thereto. The channel layer 315 is provided on an upper surface of the substrate 310. The channel layer 315 may be provided as a material layer separate from the substrate 310. The channel layer 315 may include, for example, at least one of an oxide semiconductor, a nitride semiconductor, an oxynitride semiconductor, a 2D material, quantum dots, and an organic semiconductor. The oxide semiconductor may include, for example, InGaZnO, the 2D material may include, for example, transition metal dichalcogenide (TMD) and/or graphene, and the quantum dots may include colloidal QDs, a nanocrystal structure, or the like. However, this is merely an example, and example embodiments are not limited thereto.

A source 321 and a drain 322 may be formed on both sides of the channel layer 315, respectively. The source 321 and the drain 322 may be formed with an epitaxial deposition process; however, example embodiments are not limited thereto. The source 321 may be provided to be connected to one side of the channel layer 315, and the drain 322 may be provided to be connected to the other side of the channel layer 315. The source and drain 321 and 322 may include a conductive material. The insulation layer 330, the fixed charge layer 370, the ferroelectric layer 340, and the gate 350 are sequentially stacked on the channel layer 315. This has been described above, and thus a detailed description thereof will be omitted.

FIGS. 8A through 8D are views for explaining a method of a manufacturing or fabricating the semiconductor device 200, according to some example embodiments.

Figure 8A:
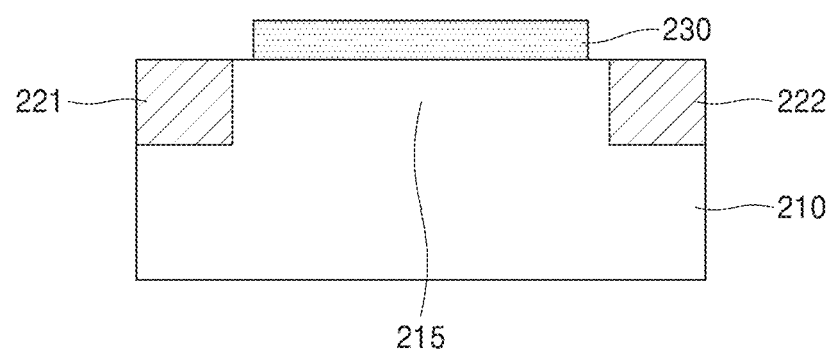
FIGS. 8A through 8D are views for explaining a method of a manufacturing a semiconductor device, according to some example embodiments.

Referring to FIG. 8A, the substrate 210 on which the source and drain 221 and 222 and the channel layer 215 are provided is prepared. The source 221 and the drain 222 may be formed by implanting/doping impurities into different regions of the substrate 210, and a region of the substrate 210 between the source 221 and the drain 222 may be defined as the channel layer 215.

The substrate 210 may include, for example, Si, Ge, SiGe, or Group III-V semiconductor. The substrate 210 may be, for example, a wafer, such as a 200 mm or a 300 mm silicon wafer; however, example embodiments are not limited thereto. Similar to the substrate 210, the channel layer 215 may include Si, Ge, SiGe or Group III-V semiconductor. However, example embodiments of the present disclosure are not limited thereto, and the material of the substrate 210 may vary. The time point when the source 221 and the drain 222 are formed may vary. For example, after the gate 250 of FIG. 8D, which will be described later, is formed, the source 221 and the drain 222 may be formed within the substrate 210.

For example, as shown in FIG. 7, the channel layer 315 may be a material layer separate from the substrate 310 and thus may be formed on the upper surface of the substrate 310. In this case, the material composition of the channel layer 315 may vary. For example, the channel layer 315 may include, for example, at least one of an oxide semiconductor, a nitride semiconductor, an oxynitride semiconductor, a 2D material, quantum dots, and an organic semiconductor. The oxide semiconductor may include, for example, InGaZnO, the 2D material may include, for example, TMD or graphene, and the quantum dots may include colloidal QDs, a nanocrystal structure, or the like. However, example embodiments of the present invention are not limited thereto.

Next, the insulation layer 230 is formed on an upper surface of the channel layer 215 of the substrate 210. The insulation layer 230 may be formed by depositing a predetermined insulating material on the upper surface of the channel layer 215 of the substrate 210 by using, for example, at least one of a thermal oxidation process, a spin-on-dielectric process, an Atomic Layer Deposition (ALD) and/or Chemical Vapor Deposition (CVD). The insulation layer 230 may include a paraelectric material or a high-k material. For example, the insulation layer 230 may include at least one of silicon oxide, silicon nitride, aluminum oxide, hafnium oxide, or zirconium oxide or may include a 2D insulator such as h-BN. However, this is merely an example.

Figure 8B:
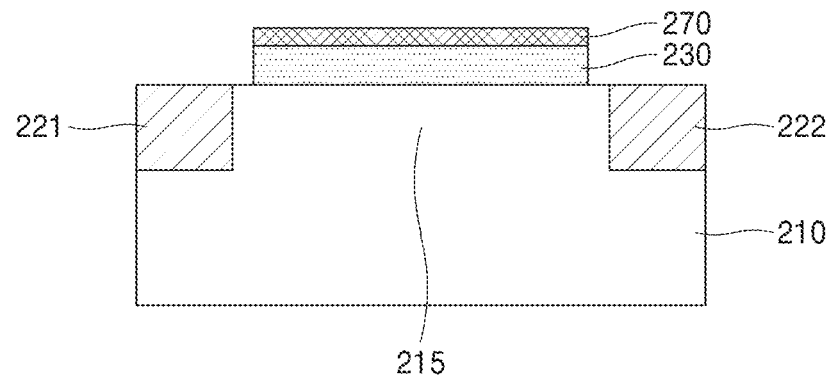

Referring to FIG. 8B, the fixed charge layer 270 having a charge density of specific or predetermined polarity is formed on an upper surface of the insulation layer 230. The fixed charge layer 270 may be formed to have a charge density that generates the negative capacitance effect in an inversion state of the channel layer 315.

In a semiconductor device of an NMOS structure, the fixed charge layer 270 may have a positive (+) charge density, and alternatively in a semiconductor device of a PMOS structure, the fixed charge layer 270 may have a negative (−) charge density. For example, in a semiconductor device of a PMOS structure, the fixed charge layer 270 may have a negative (−) charge density greater than −5 $\mu C/cm^2$ and less than 0, and in a semiconductor device of an NMOS structure, the fixed charge layer 270 may have a positive (+) charge density greater than 0 and less than +5 $\mu C/cm^2$.

The fixed charge layer 270 may be formed by depositing or implanting dopant particles including charges of a specific (or, alternatively, predetermined) polarity on a surface of the insulation layer 230. The dopant particles may include at least one selected from, for example, Al, P, Ca, Sc, V, Cr, Sr, Y, Nb, Mo, Tm, Yb, Lu, Ta, and W. However, example embodiments are not limited thereto. Alternatively or additionally, the fixed charge layer 270 may be formed by processing the upper surface of the insulation layer 230. For example, when the upper surface of the insulation layer 230 is damaged by certain processes such as at least one of plasma, ion beams, or the like, an oxygen vacancy is formed on the upper surface of the insulation layer 230, and thus the fixed charge layer 270 including charges of a specific (or predetermined) polarity may be formed.

Figure 8C:
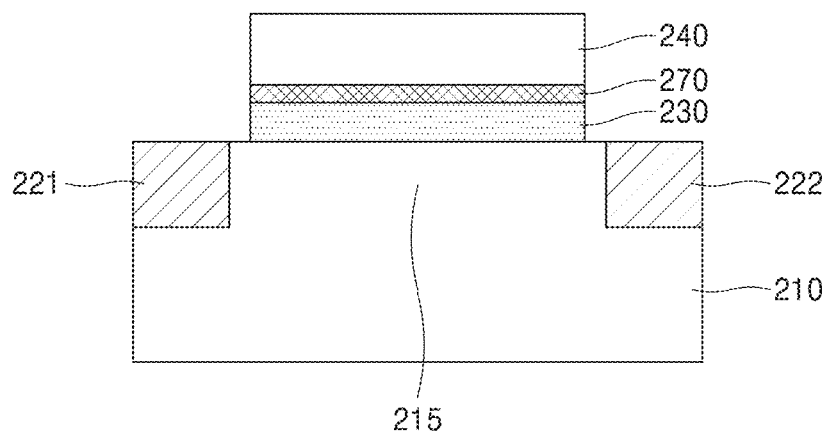

Referring to FIG. 8C, the ferroelectric layer 240 is formed on the fixed charge layer 270. The ferroelectric layer 240 may be formed by depositing a specific (or, alternatively, predetermined) dielectric material on the fixed charge layer 270 by using ALD and/or CVD and then by annealing or heat treating the dielectric material.

The ferroelectric layer 240 may include, for example, ferroelectrics such as a fluorite-based material and/or a perovskite. The perovskite may include, for example, PZT, $BaTiO_3$, or $PbTiO_3$. The fluorite-based material may include, for example, at least one oxide selected from Hf, Si, Al, Zr, Y, La, Gd, and Sr.

For example, the ferroelectric layer 240 may include at least one of HfO, ZrO, and HfZrO. The ferroelectric layer 240 may further include at least one dopant from among Si, Al, La, Y, Sr, and Gd. However, the aforementioned materials are only an example, and various other materials may be used to form the ferroelectric layer 240.

Figure 8D:
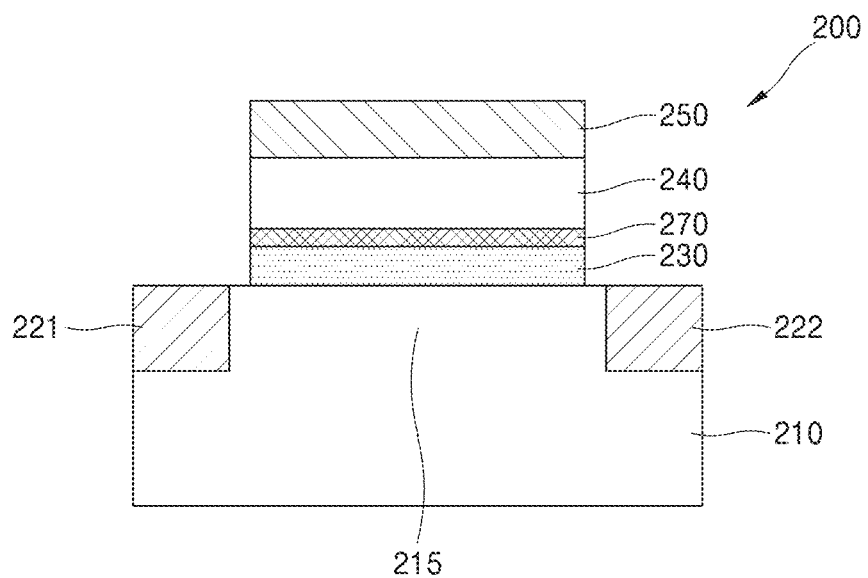

Referring to FIG. 8D, the semiconductor device 200 may include forming the gate 250 on the ferroelectric layer 240. The semiconductor device 200 may be, or may not be, completed by forming the gate 250 on the ferroelectric layer 240. The gate 250 may be formed by depositing a predetermined conductive metal on the ferroelectric layer 240 by using, for example, at least one of ALD, CVD, or Physical Vapor Deposition (PVD) and then annealing or heat treating the deposited conductive metal.

Although it has been described above that annealing is performed both when forming the ferroelectric layer 240 and when forming the gate 250, annealing is performed after a predetermined dielectric material and a specific (or, alternatively, predetermined) conductive metal are deposited on the fixed charge layer 270, and thus the ferroelectric layer 240 and the gate 250 may be simultaneously formed.

As described above, an operation of adjusting the work function of the gate 250 may be further performed, for example after the semiconductor device 200 is completed or fabricated. As described above, when the work function of the gate 250 is adjusted, the threshold voltage of the semiconductor device 200 may be controlled to have a specific, e.g. a desired value.

As described above, a semiconductor device may adjust a negative capacitance region according to a state of the semiconductor device by adjusting the charge density of a fixed charge layer. For example, voltage amplification may be improved or maximized by generating a negative capacitance effect in an inversion state of the semiconductor device by using the fixed charge layer, and thus performance of the semiconductor device may be more improved.

Because the threshold voltage of the semiconductor device may be controlled by adjusting the work function of a gate, the threshold voltage of the semiconductor device may be more constantly maintained as a desired value by adjusting the work function of the gate. The remnant polarization Pr and/or the coercive electric field Ec of ferroelectrics is increased by adjusting a method of depositing ferroelectrics and/or a method of annealing ferroelectrics, leading to an improvement in the negative capacitance effect.

Figure 9:
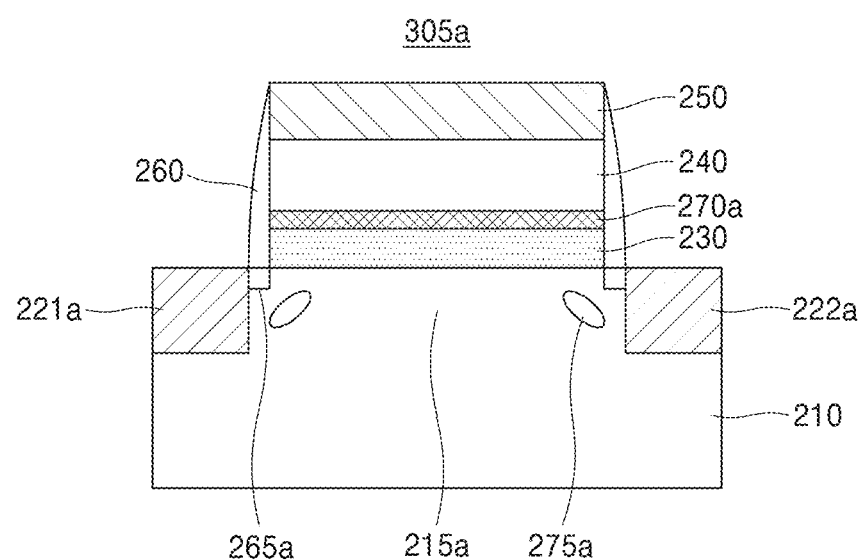
FIG. 9 is a schematic cross-sectional view of a semiconductor device according to some example embodiments.
Figure 9:
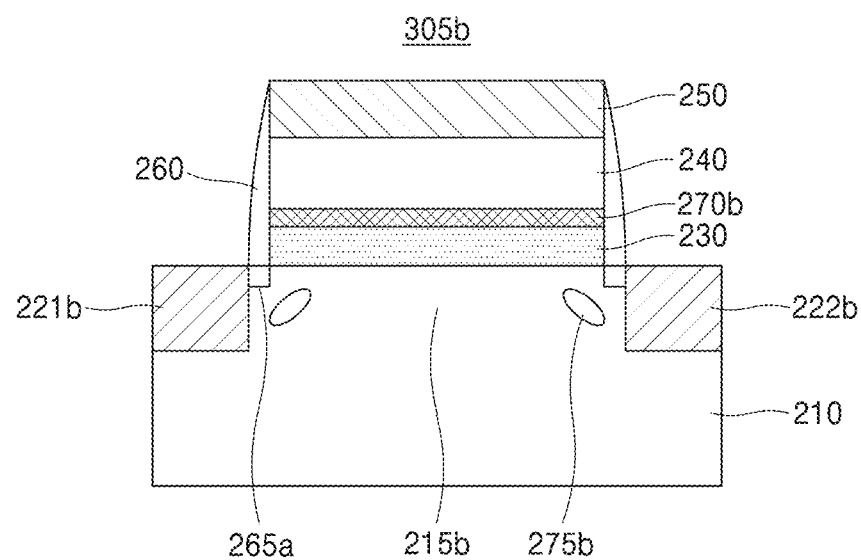

FIG. 9 illustrates a semiconductor device according to some example embodiments.

Referring to FIG. 9, a semiconductor device 300 may include structures or transistors 305a and 305b. Transistor 305a may include a first channel region 215a, a first source region 221a, a first drain region 222a, first lightly doped drain (LDD) regions 265a, first halo regions 275a, an insulating layer 230, a first fixed charge layer 270a, a spacer 260, a ferroelectric layer 240, and a gate 250. Transistor 305b may include a second source region 221b, a second drain region 222b, second lightly doped drain (LDD) regions 265b, second halo regions 275b, insulating layer 230, a second fixed charge layer 270b, a spacer 260, ferroelectric layer 240, and gate 250. Transistor 305a may be, for example, an NMOS transistor, and transistor 305b may be, for example, a PMOS transistor; however, example embodiments are not limited thereto. Both transistors 305a and 305b may be on the common substrate 210.

The first source region 221a, the first drain region 222a, and the first LDD regions may include impurities of a first conductivity type. For example, the first source region 221a, the first drain region 22a, and the first LDD regions may include at least one of phosphorus or arsenic. The first channel region 215a and the first halo regions 275a may include impurities of a second conductivity type opposite to the first conductivity type. For example, the first channel region 215a and the first halo regions 275a may include boron.

The second source region 221b, the second drain region 222b, and the second LDD regions may include impurities of the second conductivity type. For example, the second source region 221b, the second drain region 222b, and the second LDD regions may include boron. The second channel region 215b and the second halo region 275b may include impurities of the first conductivity type. For example, the second channel region 215b and the second halo region 275b may include at least one of phosphorus or arsenic.

The first fixed charge layer 270a may have a positive (+) charge density. For example, the first fixed charge layer 270a may have a charge density greater than 0 and less than +5 $\mu C/cm^2$. The second fixed charge layer 270b may have a negative (−) charge density. For example, the second fixed charge layer 270b may have a charge density greater than −5 $\mu C/cm^2$ and less than 0.

The spacer 260 may include a nitride, such as silicon nitride. The substrate 210, the insulating layer 230, the ferroelectric layer 240, and the gate 250 may be the same or similar to those described above.

Figure 10:
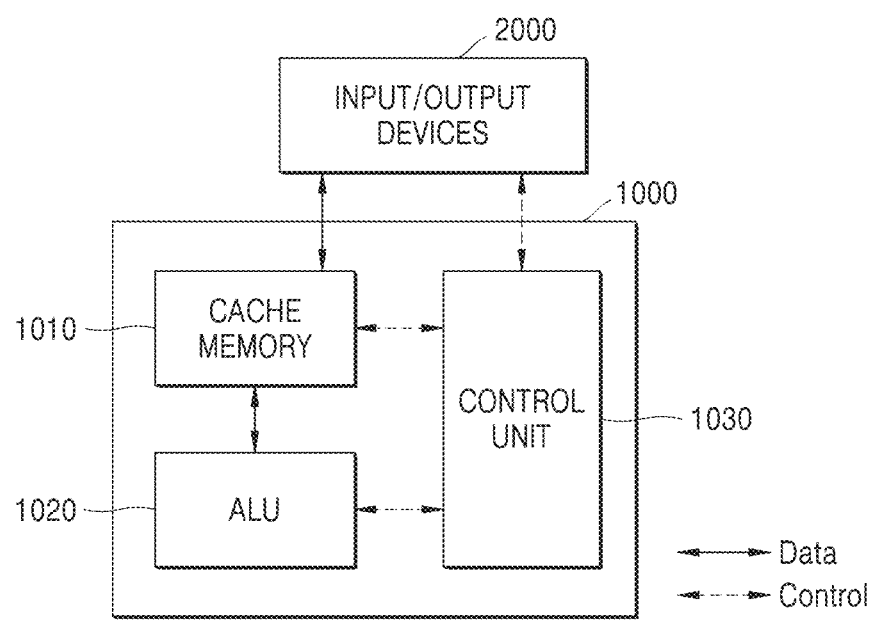
FIG. 10 is a conceptual view schematically illustrating electronic device architectures applicable to electronic devices according to some example embodiments.

FIG. 10 is a conceptual view schematically illustrating electronic device architectures applicable to electronic devices according to some example embodiments.

Referring to FIG. 10, an electronic device architecture 1000 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1000 may be implemented as a single chip including the memory unit 1010, the ALU 1020, and the control unit 1030. For example, the memory unit 1010, the ALU 1020, and the control unit 1030 may be connected to each other through metal lines on a chip for direct communication therebetween. The memory unit 1010, the ALU 1020, and the control unit 1030 may be monolithically integrated on a single substrate to form a single chip. Input/output devices 2000 may be connected to the electronic device architecture (chip) 1000.

Any of, or all of, the memory unit 1010, the ALU 1020, and the control unit 1030 may each independently include the above-described semiconductor devices (FeFETs having a fixed charge layer). For example, the ALU 1020 and the control unit 1030 may each independently include FeFETs and semiconductor devices such as those described above, and the memory unit 1010, FeFETs such as those described above, or combinations thereof. The memory unit 1010 may include a main memory and a cache memory. The electronic device architecture (chip) 1000 may be or may include an on-chip memory processing unit.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Example embodiments are not necessarily limited to those described above. Furthermore example embodiments are not necessarily mutually exclusive to one another. For example, some example embodiments may include features described with reference to one figure, and may also include features described with reference to another figure.

It should be understood that some example embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A semiconductor device comprising:
   a substrate;
   a channel layer at least one of on or in the substrate;
   an insulation layer on the substrate;
   a ferroelectric layer on the insulation layer;
   a fixed charge layer on an interface between the insulation layer and the ferroelectric layer, the fixed charge layer including charges of a first polarity; and
   a gate on the ferroelectric layer,
   wherein the fixed charge layer is configured to have a charge density that generates a negative capacitance effect in response to the channel layer being in an inversion state, the fixed charge layer having a charge density greater than −5 $\mu C/cm^2$ and less than 0, or a charge density greater than 0 and less than +5 $\mu C/cm^2$.

2. The semiconductor device of claim 1,
   wherein at least one of the semiconductor device includes a PMOS structure and the fixed charge layer has a negative (−) charge density in the PMOS structure, or the semiconductor device includes an NMOS structure and the fixed charge layer has a positive (+) charge density in the NMOS structure.

3. The semiconductor device of claim 1,
   wherein the fixed charge layer includes at least one of dopants or an oxygen vacancy.

4. The semiconductor device of claim 3,
   wherein the dopants include at least one selected from Al, P, Ca, Sc, V, Cr, Sr, Y, Nb, Mo, Tm, Yb, Lu, Ta, and W.

5. The semiconductor device of claim 1,
   wherein the channel layer is in an upper portion of the substrate and is integral with the substrate, and
   a source and a drain are on respective sides of the channel layer.

6. The semiconductor device of claim 1,
   wherein the channel layer is on the substrate and separate from the substrate, and
   a source and a drain are on respective sides of the channel layer.

7. The semiconductor device of claim 1,
wherein the channel layer includes at least one of Si, Ge, SiGe, Group III-V semiconductor, an oxide semiconductor, a nitride semiconductor, an oxynitride semiconductor, a two-dimensional (2D) material, quantum dots, and an organic semiconductor.

8. The semiconductor device of claim 1,
wherein the ferroelectric layer includes at least one of a fluorite-based material or perovskite.

9. The semiconductor device of claim 8,
wherein the ferroelectric layer includes at least one of HfO, ZrO, and HfZrO.

10. The semiconductor device of claim 9,
wherein the ferroelectric layer further includes at least one dopant from among Si, Al, La, Y, Sr, and Gd.

11. The semiconductor device of claim 1,
wherein a work function of the gate is configured to control a threshold voltage of the semiconductor device.

12. The semiconductor device of claim 1, further comprising:
a source region; and
a drain region, wherein
the semiconductor device is configured to operate in the inversion state in response to a voltage between the gate and the source region being greater than a threshold voltage of the semiconductor device.

13. A semiconductor device comprising:
a first channel layer at least one of on or in a substrate;
an insulation layer on the first channel layer;
a ferroelectric layer on the insulation layer; and
a first fixed charge layer on an interface between the insulation layer and the ferroelectric layer, the first fixed charge layer including charges of a first polarity,
wherein the first fixed charge layer is configured to have a charge density that generates a negative capacitance effect in response to the first channel layer being in an inversion state, the first fixed charge layer having a charge density greater than $-5\ \mu C/cm^2$ and less than 0, or a charge density greater than 0 and less than $+5\ \mu C/cm^2$.

14. The semiconductor device of claim 13, further comprising:
a source region in the substrate, the source region on a first side of the first channel layer; and
a first lightly doped drain region in the substrate, the first lightly doped drain region between the source region and the first channel layer.

15. The semiconductor device of claim 13, further comprising:
a second channel layer in the substrate, the insulation layer on the second channel layer, the ferroelectric layer on the first channel layer and on the second channel layer; and
a second fixed charge layer on a second interface between the insulation layer and the ferroelectric layer over the second channel layer.

16. The semiconductor device of claim 15, wherein the first fixed charge layer has a negative (−) charge density, and the second fixed charge layer has a positive (+) charge density.

17. The semiconductor device of claim 15, further comprising:
a drain region in the substrate, the drain region on a first side of the second channel layer; and
a second lightly doped drain region in the substrate, the second lightly doped drain region between the drain region and the second channel layer.

18. The semiconductor device of claim 13, further comprising:
a gate;
a source region; and
a drain region, wherein
the semiconductor device is configured to operate in the inversion state in response to a voltage between the gate and the source region being greater than a threshold voltage of the semiconductor device.

19. A semiconductor device comprising:
a first channel layer at least one of on or in a substrate;
an insulation layer on the first channel layer;
a ferroelectric layer on the insulation layer;
a first fixed charge layer on an interface between the insulation layer and the ferroelectric layer, the first fixed charge layer including charges of a first polarity;
a second channel layer in the substrate, the insulation layer on the second channel layer, the ferroelectric layer on the first channel layer and on the second channel layer; and
a second fixed charge layer on a second interface between the insulation layer and the ferroelectric layer over the second channel layer.

20. The semiconductor device of claim 19, wherein the first fixed charge layer has a negative (−) charge density, and the second fixed charge layer has a positive (+) charge density.

21. The semiconductor device of claim 19,
wherein at least one of the semiconductor device includes a NMOS structure and the first fixed charge layer has a positive (+) charge density in the NMOS structure, and
the semiconductor device includes an PMOS structure and the second fixed charge layer has a negative (−) charge density in the PMOS structure.

22. The semiconductor device of claim 19 further comprising:
a gate on the ferroelectric layer, wherein a work function of the gate is configured to control a threshold voltage of the semiconductor device.

23. The semiconductor device of claim 19,
wherein the first fixed charge layer has a charge density greater than 0 and less than $+5\ \mu C/cm^2$, and
wherein the second fixed charge layer has a charge density greater than $-5\ \mu C/cm^2$ and less than 0.

24. The semiconductor device of claim 19, further comprising:
a source region in the substrate, the source region on a first side of the first channel layer; and
a first lightly doped drain region in the substrate, the first lightly doped drain region between the source region and the first channel layer.

25. The semiconductor device of claim 19, further comprising:
a drain region in the substrate, the drain region on a first side of the second channel layer; and
a second lightly doped drain region in the substrate, the second lightly doped drain region between the drain region and the second channel layer.

* * * * *